(12) United States Patent
Rose et al.

(10) Patent No.: US 9,753,151 B2
(45) Date of Patent: Sep. 5, 2017

(54) LIGHT GUIDE ARRAY FOR PET DETECTOR FABRICATION METHODS AND APPARATUS

(71) Applicant: General Electric Company, Schenectady, NY (US)

(72) Inventors: James Wilson Rose, Guilderland, NY (US); David Leo McDaniel, Dousman, WI (US); Jianjun Guo, Ballston Spa, NY (US); Sergei Ivanovich Dolinsky, Clifton Park, NY (US); Adrian Ivan, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 101 days.

(21) Appl. No.: 14/815,107

(22) Filed: Jul. 31, 2015

(65) Prior Publication Data
US 2017/0031038 A1    Feb. 2, 2017

(51) Int. Cl.
*G01T 1/20*    (2006.01)
*G01T 1/208*    (2006.01)
(Continued)

(52) U.S. Cl.
CPC ............ *G01T 1/2018* (2013.01); *G01T 1/208* (2013.01); *G01T 1/2985* (2013.01); *H01L 27/14663* (2013.01); *H01L 27/14685* (2013.01)

(58) Field of Classification Search
CPC .................................................. G01T 1/2018
See application file for complete search history.

(56) References Cited

U.S. PATENT DOCUMENTS 5,707,684 A * 1/1998 Hayes .................... B29C 41/36
                                                            347/1
5,723,176 A * 3/1998 Keyworth ............... B29C 41/22
                                                            118/300
(Continued)

FOREIGN PATENT DOCUMENTS

JP    2013087162 A  *  5/2013  ............. H01L 31/02
WO       02093204 A2     11/2002

OTHER PUBLICATIONS

Du, Huini et al., "Measurements of wavelength shifting (WLS) fibre readout for a highly multiplexed, depth-encoding PET detector", Physics in Medicine and Biology, vol. 52 Issue 9, Apr. 11, 2007, IOP Publishing, DOI: 10.1088/0031-9155/52/9/011, (pp. 2499-2514, 16 total pages).

(Continued)

*Primary Examiner* — David Porta
*Assistant Examiner* — Jeremy S Valentiner
(74) *Attorney, Agent, or Firm* — Pabitra K. Chakrabarti

(57) ABSTRACT

A photon detector having an optical transparent plate and photodiode array interconnected by an optical light guide array. The optical light guide array including elements providing a transmission line between the optical transparent plate and the photodiode array, where the position of one or more optical light guide elements is formed to adjust for a miss-registered photodiode individual element. A method for assembling the photon detector includes depositing a non-wetting film on opposing surfaces of the optical transparent plate and/or photodiode array, altering the deposited non-wetting film in regions of individual photodiode elements, dispensing an optical coupler adhesive on the optical transparent plate and photodiode array to form adhesive beads, aligning the opposing surfaces, assembling the opposing surfaces so that the corresponding optical coupler adhesive beads contact each other, and curing the optical (Continued)

coupler adhesive to form a structurally merged photon detector having optical light guide elements.

16 Claims, 5 Drawing Sheets

(51) Int. Cl.
    *G01T 1/29*           (2006.01)
    *H01L 27/146*     (2006.01)

(56) References Cited

U.S. PATENT DOCUMENTS

| | | | |
|---|---|---|---|
| 2003/0194192 A1* | 10/2003 | Ido | G02B 6/12 |
| | | | 385/129 |
| 2005/0023473 A1 | 2/2005 | Burr et al. | |
| 2006/0202128 A1* | 9/2006 | Berger | G01T 1/20 |
| | | | 250/370.11 |
| 2008/0048102 A1 | 2/2008 | Kurtz et al. | |
| 2008/0237477 A1 | 10/2008 | Hoggatt et al. | |
| 2012/0001075 A1 | 1/2012 | Frach et al. | |
| 2012/0235047 A1 | 9/2012 | Lewellen et al. | |
| 2013/0134311 A1 | 5/2013 | Takayama | |
| 2013/0208857 A1 | 8/2013 | Arodzero et al. | |
| 2013/0249035 A1 | 9/2013 | Hedler et al. | |
| 2014/0224992 A1 | 8/2014 | Kusner | |
| 2015/0285923 A1* | 10/2015 | Tonami | G01T 1/249 |
| | | | 250/368 |
| 2016/0064579 A1* | 3/2016 | Hirigoyen | H01L 31/02164 |
| | | | 257/435 |

OTHER PUBLICATIONS

Stewart, A.G., et al., "Properties of silicon photon counting detectors and silicon photomultipliers", Journal of Modern Optics, vol. 56, Nos. 2-3, Jan. 20-Feb. 10, 2009, ISSN: 0950-0340, DOI: 10.1080/09500340802474525, (pp. 240-252, 13 total pages).

* cited by examiner

LIGHT GUIDE ARRAY FOR PET DETECTOR FABRICATION METHODS AND APPARATUS

BACKGROUND

Photon detectors for positron emission tomography (PET) imaging systems typically include a photo sensor element and a scintillator element. Visible (or near visible) photon(s) are emitted from the scintillator when a high energy photon created by the annihilation of a positron from a radioactive tracer strikes the scintillator. These scintillation photons can be detected by the photo sensor(s). Signals from the photosensors representing the annihilation photon event are combined and used to create images of a region-of-interest undergoing imaging.

Conventional PET scanners can utilize a silicon photo multiplier (SiPM) as the light sensor. A SiPM can be an array of passively quenched Geiger-mode avalanche photodiodes (APD) that react to impinging photons. The SiPM can provide information about certain parameters, such as the time of the impingement event, the energy associated with the event, and the position of the event within the detector. These parameters can be determined through processing algorithms applied to the analog signals generated by the SiPM. Some conventional SiPMs can produce very fast signals, which provides a high degree of timing accuracy.

SiPMs provide certain advantages over conventional photomultiplier tubes (PMTs), and are therefore being used in many applications, including Positron Emission Tomography for medical imaging. These advantages include better photon detection efficiency (i.e., a high probability of detecting an impinging photon), better timing performance (i.e., determine the time of the arrival of the photons with higher precision), compactness, ruggedness, low operational voltage, insensitivity to magnetic fields and low cost.

A SiPM consists of a large array of microcells. A microcell contains a Single Photon Avalanche Diode (SPAD) which is a photodiode biased above its breakdown voltage. When a photon interacts in the SPAD, the diode breaks down and produces a large discharge current. In an analog SIPM, a quenching resistor is placed in series with the SPAD. As the discharge current increases, the voltage drop across the quenching resistor increases and the voltage across the SPAD decreases. When the voltage across the SPAD drops below the breakdown voltage, the discharge stops and the voltage across the SPAD will increase until it reaches the bias voltage. At that point, the SPAD is ready to detect the next photon that interacts in it. The currents thru the quenching resistor during the discharge and recharging of the SPADs in the SiPM are combined and measured to determine the time a light pulse struck the SiPM and the number of photons in the light pulse.

In a digital SiPM, circuitry is added to each microcell. The microcell circuitry processes the signal produced from a SPAD and the outputs signals from the circuits are combined to determine the time a light pulse struck the SiPM and the number of photons in the light pulse. The quenching resistor may be present or it can be replaced with a digitally controlled reset circuit.

For both the Analog and Digital SiPM, the area covered by a microcell includes the area of the SPAD, the area covered by the quenching resistor and/or microcell electronics, traces (for signals and voltages), and the spacing between microcells required for electronic isolation. Photons that hit the area of a microcell that is outside the photo sensitive area of the SPAD are generally not detected and the ratio of the photo sensitive area of the SPAD to the total area of the microcell (the Fill Factor) is a critical parameter in determine the probability that a photon which hits the SiPM will be detected (Photon Detection Efficiency: PDE).

The area covered by the electronics and/or the quenching resistor is essentially independent of the SPAD size, and the areas required for electronics isolations and traces nominally increase proportionally to the square root of the microcell area. Therefore, a common method of increasing the PDE is to increase the area of the SPAD in the SiPM.

However, increasing the size of the SPAD also adversely affects other SiPM parameters. In particular, the probabilities of producing an after pulsing events and optical cross talk events increase with the area of the SPAD. An after pulse event occurs when an electron or hole generated during the discharge of a microcell becomes trapped in an energy level of the silicon, the electron or hole is thermally released from the trap in a time that can vary from a few nanoseconds to several microseconds, and the released electron or hole initiates another discharge of the microcell. An optical cross talk event occurs when a photon produced by the discharge of a microcell travels to a neighboring microcell and initiates a discharge in that microcell. The probability of creating an after pulse event or an optical crosstalk event increase essentially linear with the area of the SPAD. The PDE of an SiPM can be enhanced by placing an optical structure on top of the microcell which directs light away from the dead space of the microcell and onto the active area of the SPAD

DESCRIPTION

In accordance with embodiments, a method of fabrication for a photon detector includes creating an array of optical light guides between corresponding single photon avalanche diode (SPAD) microcells on the photodiode array and an optical transparent plate to improve light detection by the photon detector.

Figure 1:
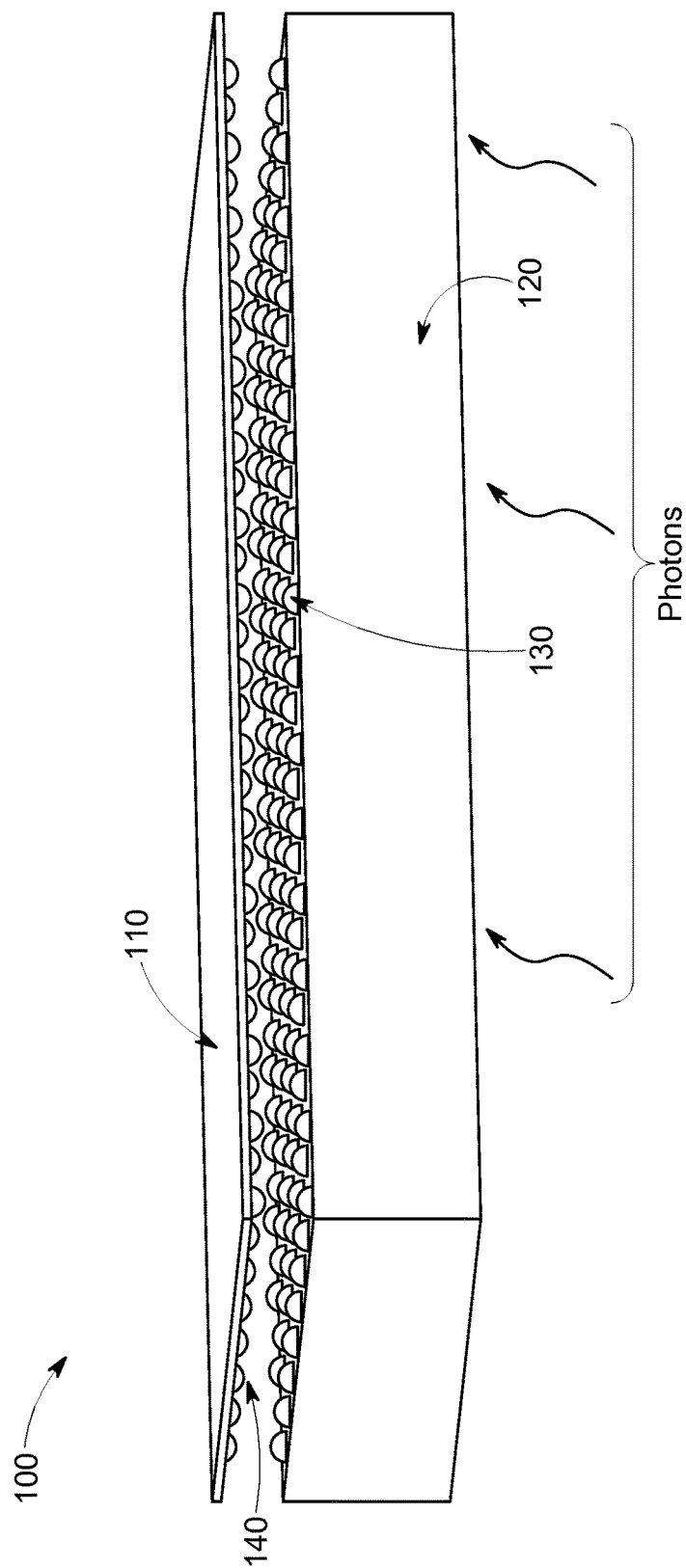
FIG. 1 depicts an unassembled photon detector array in accordance with embodiments.

FIG. 1 depicts unassembled photon detector array 100 in accordance with some embodiments. This photon detector array includes a SiPM light sensor photodiode array 110 that includes a plurality of microcells each containing a SPAD. Optical coupler adhesive bead array 130 is deposited on a surface of a glass plate 120 opposing the photodiode array. Similarly, optical coupler adhesive bead array 140 is deposited on a surface of photodiode array 110 opposing the glass plate.

In some implementations, the glass plate can be a plate of any optically transparent material—for example, plastic. In other implementations (e.g., such as PET, nuclear medicine, and other ionizing radiation applications), an embodying detector array can be fabricated with a scintillator crystal or ceramic, or a matrix of pieces of scintillator crystal or ceramic, substituted for the glass plate.

Figure 2:
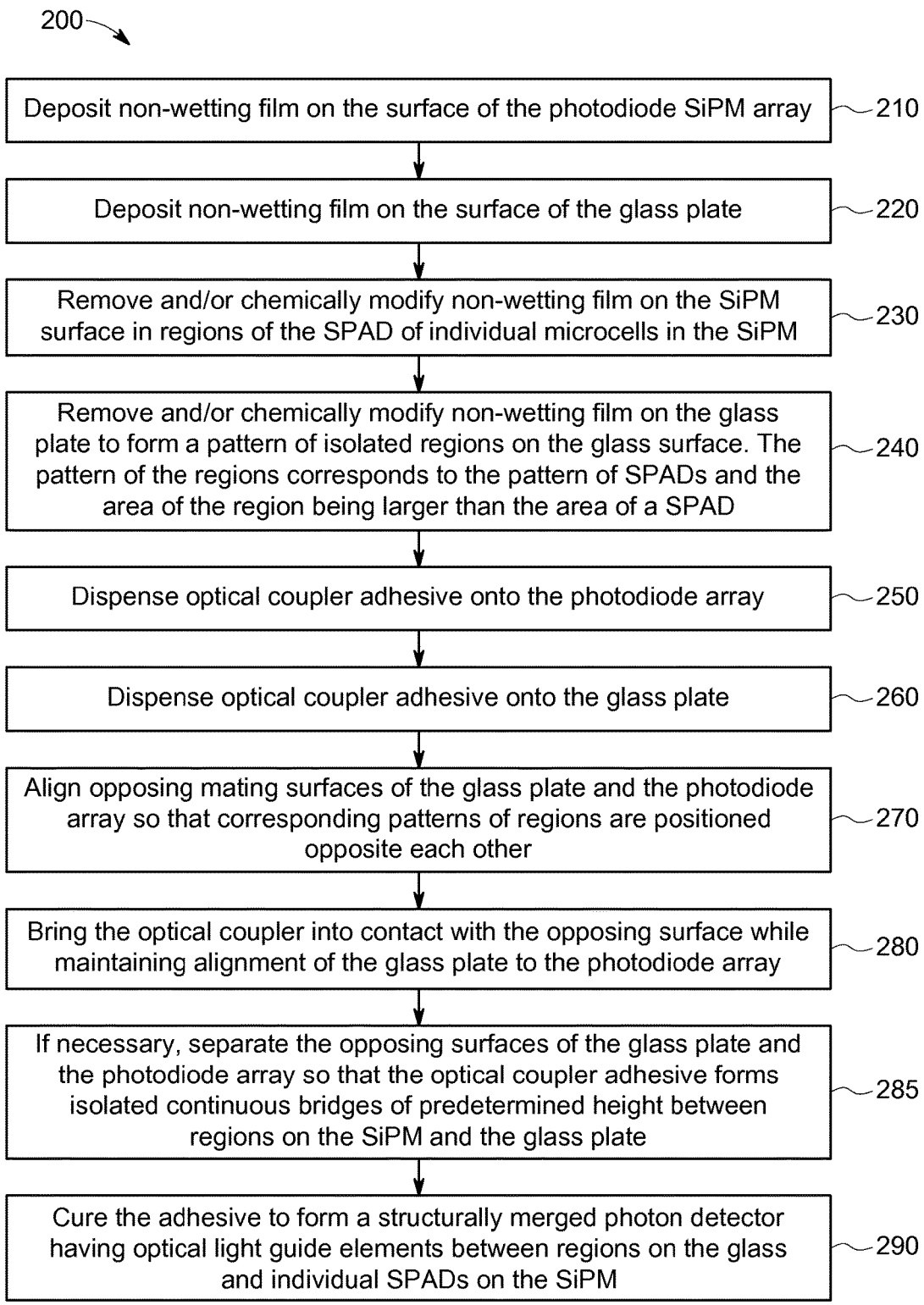
FIG. 2 depicts a process flowchart for fabrication of a photon detector array in accordance with embodiments.

FIG. 2 depicts a flowchart for process 200 for the fabrication of a photon detector array in accordance with embodiments. A non-wetting film is deposited, steps 210 and 220, on opposing surfaces of a photodiode array and a glass plate, respectively. These opposing surfaces will later mate to form part of the photon detector. A non-wetting film is one that does not wet with an uncured, liquid optical coupler adhesive that will subsequently be applied. One class of such non-wetting films includes fluorinated polymers.

After deposition, regions of the non-wetting film deposited over about the photosensitive area of the individual SiPM microcells can be either removed and/or chemically modified, step 230. Regions of the non-wetting film deposited on the glass plate which correspond to microcells in the SiPM can be either removed and/or chemically modified, step 240. These regions on the glass correspond to the photosensitive regions of the microcells and a fraction of the non-photosensitive area between the microcells. Thus the area of a region on the glass is larger than the area of the corresponding region on the SiPM. This removal/modification of the non-wetting film leaves the treated regions of the scintillator elements and photodiode pixels readily able to wet with the above mentioned uncured liquid optical coupler adhesive. In other implementations, the non-wetting film can be applied utilizing a hard or stencil mask which would simplify the patterning process and eliminate etching. In another implementation, a liftoff process (similar to a typical resist liftoff process) can remove the non-wetting film from the desired contact area of the active devices (i.e., the glass plate and photodiode pixels). The pattern of the non-wetting film can also be printed on the SiPM and/or glass plate.

In steps 250 and 260, the liquid optical coupler adhesive is dispensed onto the photodiode array and the glass plate, respectively. The differential surface energies of the wetting and non-wetting regions cause the liquid optical coupler adhesive to form an array of optical coupler adhesive beads, where the beads have about identical shape and volume. Each optical coupler adhesive bead is centered over either a photodiode pixel or glass plate, as depicted in FIG. 1.

Figure 3:
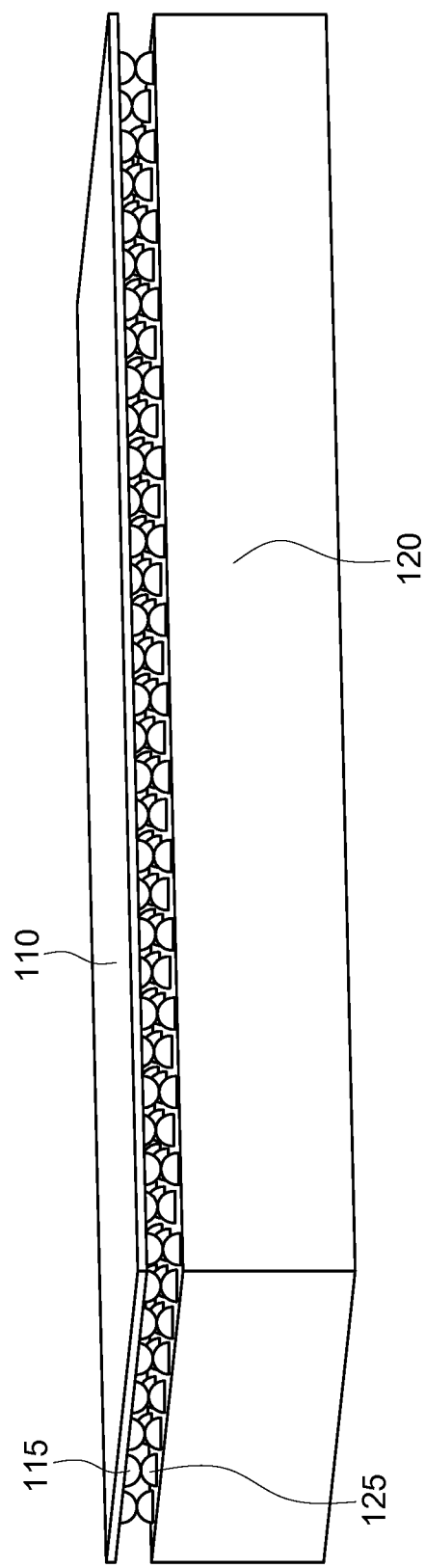
FIG. 3 depicts the photon detector of FIG. 1 during a stage of fabrication in accordance with embodiments.

Opposing mating surfaces of glass plate 120 and photodiode array 110 are aligned, step 270, such that the opposing mating surfaces face each other, and corresponding optical coupler adhesive beads 115, 125 are positioned opposite each other. The photon detector is assembled, step 280, by bringing the opposing surfaces of the glass plate and the photodiode array towards each other so that the corresponding optical coupler adhesive beads contact each other, as shown in FIG. 3—which depicts an embodying photon detector during fabrication.

Figure 4:
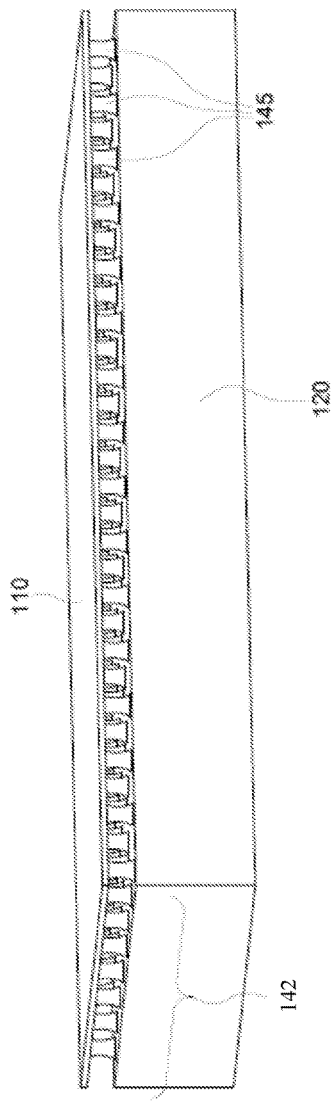
FIG. 4 depicts a photon detector in accordance with embodiments.

When these optical coupler adhesive beads make contact, surface tension causes the beads to form the structures shown in FIG. 4. If the photodiode array is subsequently allowed to move freely with respect to the glass plate, the photodiode will translate and/or rotate until the net surface tension of the array of adhesive bead is a minimum. This effect can be used in order to achieve better alignment between the elements of these arrays then was achieved by their initial positioning.

In some implementations, a controlled stand-off height between the opposing surfaces of the glass plate and the photodiode array can be established, step 285. The stand-off height can be achieved by insertion of a shim between the opposing surfaces, or use of a mechanical fixture. The optical coupler adhesive is cured, step 290, to complete the fabrication of a photon detector with an optical coupler light guide array between corresponding photodiode pixel elements and scintillator elements.

FIG. 4 depicts photon detector 400 in accordance with embodiments. Photon detector 400 includes glass plate 120 and photodiode array 110. In some implementations, a scintillator crystal or ceramic, or a matrix of pieces of scintillator crystal or ceramic can be substituted for the glass plate. Between the glass plate and the photodiode array, photon detector 400 includes optical coupler light guide array 142, which has light guide elements 145 between corresponding photodiode pixel elements and glass plate. Each element of the optical coupler light guide array directs light from the glass plate region it is in contact with to the corresponding photodiode pixel. The geometry of the light guide is optimized to increase the probability that a photon exiting the surface of the glass plate attached to the light guide will interact in the photosensitive area of the SiPM photodiode array. This optimization can be performed through proper design of the boundaries of the wetting regions of the opposing surface of both glass plate and photodiode arrays. Additionally, modification of the non-wetting surface can be controlled to achieve a specific surface energy, resulting in a specific wetting angle of the adhesive unique to either opposing surface. In this manner, both the aperture and entry/exit angles of the light guide elements can be tailored.

If individual elements of the wetting pattern on the glass plate are misregistered with the corresponding microcell on the SiPM, the corresponding optical light guide can be slightly distorted in its position (as the center of the glass plate region is not aligned with the center of the corresponding microcell). This physical distortion, e.g., bending, of the optical light guide between two corresponding glass region and microcell region improves, in comparison to conventional alignment techniques, the coupling of light from one to the other.

In accordance with implementations, the bending and/or distortion of individual optical light guide element transmission lines can be controlled during fabrication. As the opposing surfaces of the scintillator array and photodiode array are assembled, corresponding beads of the optical coupler adhesive minimize their surface energy and form hourglass shapes. Where the wetting area on the glass is larger than the wetting area on the SiPM and the distance between the glass and the SiPM is less than or equal to the wetting area of the SiPM, the shape can more resemble a funnel.

By tailoring the contact angle of these beads, the shape of the resulting optical light guide element can be tailored. As will be appreciated by one skilled in the art, any geometry formed by the adhesive represents a three-dimensional meniscus having the minimum surface energy attainable by the adhesive fillet. The recognizable "hourglass" shape is formed by the orthogonal superposition of two radially symmetric volumes of liquid. In this context, mis-registration of individual elements leads to a non-orthogonal fillet. As described previously several parameters can be controlled to minimize the effect of atypical fillets. As an example, one design option would be to enlarge the exit aperture (i.e., the wetting region) of all elements on the glass plate, relative to corresponding entrance apertures on the photodiode array. The resulting adhesive fillet will have a geometry generally described as a truncated cone, with the wider base of the cone at the glass plate, and the tapered base at the photodiode. This geometry will tend to direct light along its axis into the photodiode element. It should be noted that the precise geometry of the fillet will still include the curvature associated with any meniscus; also that the axis of the cone will be non-orthogonal to the planes of the glass plate and photodiode arrays. In an alternate example, quantified misregistration of specific elements within the array could be addressed by a custom pattern of wetting and non-wetting regions unique to the affected elements. As described previously, this could comprise a change in the diameter of wetting region(s) of these elements; alternately, elliptical or other shapes could describe the wetting region of one or both surfaces.

In accordance with some embodiments, the alignment of the photodiode element with the scintillator element during assembly of the photon detector, contributes to minimizing the crosstalk between adjacent photodiodes. Conventional assembly of photodiodes to scintillators currently includes manual alignment of these parts, based on the edges of the parts. As the size of the pixels within the photon detector decreases, maintaining alignment is an increasingly difficult step. Optimizing the optical coupling between each scintillator element and its corresponding photodiode element of the photon detector, while eliminating crosstalk between neighboring elements are key critical-to-quality fabrication goals. Complicating alignment is the fact that the scintillators are currently manufactured in a mosaic fashion—i.e., the elements are glued together, and do not have the same element pitch on all parts. Minimizing the thickness of the optical adhesive is important to alignment and reducing crosstalk.

In accordance with some embodiments, a photon detector with optical waveguide elements formed between corresponding elements of the scintillator and photodiode arrays has maximized optical efficiency. This optimization is attained when the greatest fraction of photons exiting the glass plate ultimately impinge upon the photosensitive regions of the SiPM. For certain geometries, it may be necessary for the glass plate to have no regions that are without some thickness of optical coupler. One embodiment of this invention specifically provides for this optimization. In accordance with this embodiment, a continuous coating of optical coupler on the surface of the glass plate can be formed, while maintaining the geometry of the light guides on the surface of the photodiode array.

Figure 5:
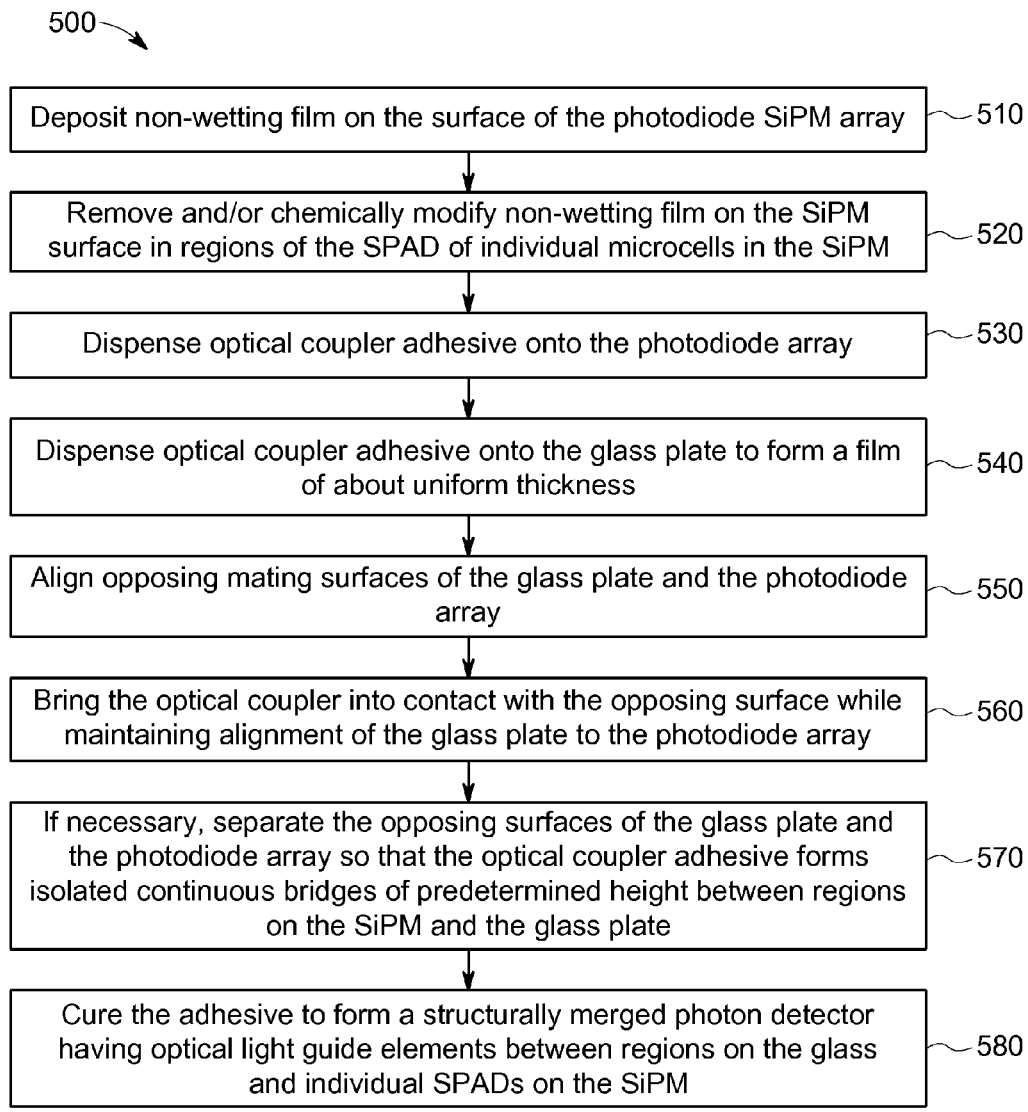
FIG. 5 depicts a process flowchart for fabrication of a photon detector array in accordance with embodiments.

FIG. 5 depicts a flowchart for process 500 for the fabrication of a photon detector array in accordance with such an embodiment. In this embodiment, since a pattern of non-wetting regions are not required on the glass, process 500 differs from process 200 (FIG. 2) by eliminating the steps that deposit and pattern the non-wetting film onto the surface of the glass plate (i.e., steps 220 and 240).

A non-wetting film is deposited, step 510, on a surface of a photodiode array. After deposition, regions of the non-wetting film deposited over about the photosensitive area of the individual SiPM microcells can be either removed and/or chemically modified, step 520.

In steps 530 and 540, a liquid optical coupler adhesive is dispensed onto the photodiode array and the glass plate, respectively. During the dispensing of optical coupler adhesive onto the glass plate, a film of about uniform thickness can be formed on the mating surface of the plate. The uniform film of adhesive on the plate can be formed, for example, by spinning the plate.

Opposing mating surfaces of glass plate 120 and photodiode array 110 are aligned, step 550, such that the opposing mating surfaces face each other. Since the plate has an about uniform layer of adhesive, the accuracy required in aligning the glass plate to the SiPM photodiode array in step 550 is less than the accuracy required in step 260 of process 200.

The photon detector is assembled, step 560, by bringing the opposing surfaces of the glass plate and the photodiode array towards each other.

In some implementations, a controlled stand-off height between the opposing surfaces of the glass plate and the photodiode array can be established, step 570.

Upon contact with the photodiode array, step 560, the optical coupler can form an array of conical meniscuses, while the glass plate will maintain a continuous layer of optical coupler, although of varying thickness. The optical coupler adhesive is cured, step 580, to complete the fabrication of a photon detector with an optical coupler light guide array between corresponding photodiode pixel elements and scintillator elements.

Although specific hardware and methods have been described herein, note that any number of other configurations may be provided in accordance with embodiments of the invention. Thus, while there have been shown, described, and pointed out fundamental novel features, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A method for assembling a photon detector, the photon detector including an optical light guide array located between an optical transparent plate and a photodiode array, the method comprising:
    depositing a non-wetting film on at least one opposing surfaces of at least one of the optical transparent plate and the photodiode array;
    altering the deposited non-wetting film in regions of photodiode elements;
    dispensing an optical coupler adhesive on to at least one of the optical transparent plate and the photodiode array to form optical coupler adhesive beads on the optical transparent plate or the photodiode elements;
    aligning the opposing surfaces of the optical transparent plate and the photodiode array;
    assembling the opposing surfaces of the optical transparent plate and the photodiode array so that the optical coupler adhesive beads contact the opposing surface; and
    curing the optical coupler adhesive beads, the cured optical coupler adhesive beads forming optical light guide elements of the optical light guide array, the optical light guide elements located between the optical transparent plate and individual photodiode elements;
    the curing of the optical coupler adhesive beads resulting in structurally merging the optical light guide array, the optical transparent plate, and the photodiode array into a structurally merged photon detector.

2. The method of claim 1, the altering the deposited non-wetting film including at least one of removing and chemically modifying the non-wetting film.

3. The method of claim 1, the altering the deposited non-wetting film is done at about the center of the photodiode elements.

4. The method of claim 1, the depositing the non-wetting film including applying the non-wetting film utilizing a mask.

5. The method of claim 1, wherein a surface tension force of the optical coupler adhesive beads can cause movement in the alignment of the optical transparent plate with respect to the photodiode array, the movement including at least one of translating and rotating either or both of the optical transparent plate and the photodiode array, as determined by the surface tension force.

6. The method of claim 1, wherein the optical transparent plate is a scintillator.

7. The method of claim 6, wherein the scintillator has elements, and the dispensing step includes dispensing the optical coupler adhesive to form optical coupler adhesive beads on corresponding scintillator elements and photodiode elements.

8. The method of claim 7, the aligning the opposing surfaces including positioning corresponding beads of optical coupler adhesive to be opposite each other.

9. The method of claim 1, wherein the optical transparent plate is a glass plate.

10. The method of claim 1, including:
forming optical coupler adhesive beads on the photodiode elements; and
applying optical adhesive to the optical transparent plate to form a film of about uniform thickness.

11. A photon detector comprising:
an optical transparent plate;
a photodiode array having individual elements;
an optical light guide array between the optical transparent plate and the photodiode array, the optical light guide array including individual optical light guide elements providing a transmission line between the optical transparent plate and individual elements of the photodiode array;
the optical light guide array prepared by a process comprising the steps of:
depositing a non-wetting film on at least one opposing surfaces of at least one of the optical transparent plate and the photodiode array;
altering the deposited non-wetting film in regions of photodiode elements;
dispensing an optical coupler adhesive on to at least one of the optical transparent plate and the photodiode array to form optical coupler adhesive beads on the optical transparent plate or the photodiode elements;
aligning the opposing surfaces of the optical transparent plate and the photodiode array;
assembling the opposing surfaces of the optical transparent plate and the photodiode array so that the optical coupler adhesive beads contact the opposing surface; and
curing the optical coupler adhesive beads, the cured optical coupler adhesive beads forming optical light guide elements of the optical light guide array, the optical light guide elements located between the optical transparent plate and individual photodiode elements;
the curing of the optical coupler adhesive beads resulting in structurally merging the optical light guide array, the optical transparent plate, and the photodiode array into a structurally merged photon detector.

12. The photon detector of claim 11, including a distortion in position of one or more individual optical light guide elements, the position distortion of respective ones of the one or more individual optical light guide elements resulting from a respective miss-registration in a position of a respective photodiode individual element.

13. The photon detector of claim 11, wherein the optical transparent plate is a scintillator.

14. The photon detector of claim 13, the scintillator having individual elements, and optical coupler adhesive beads are positioned between corresponding scintillator elements and corresponding photodiode elements to form individual optical light guide elements.

15. The photon detector of claim 14, including:
the individual elements of the scintillator array being crystals configured to emit photons when excited by incident x-ray radiation; and
the individual elements of the photodiode array being single photon avalanche diode pixels.

16. The photon detector of claim 11, wherein the optical transparent plate is a glass plate.

* * * * *